July 18, 1972 LE CONTE CATHEY 3,677,825
THERMOELECTRIC GENERATOR
Filed Oct. 30, 1968
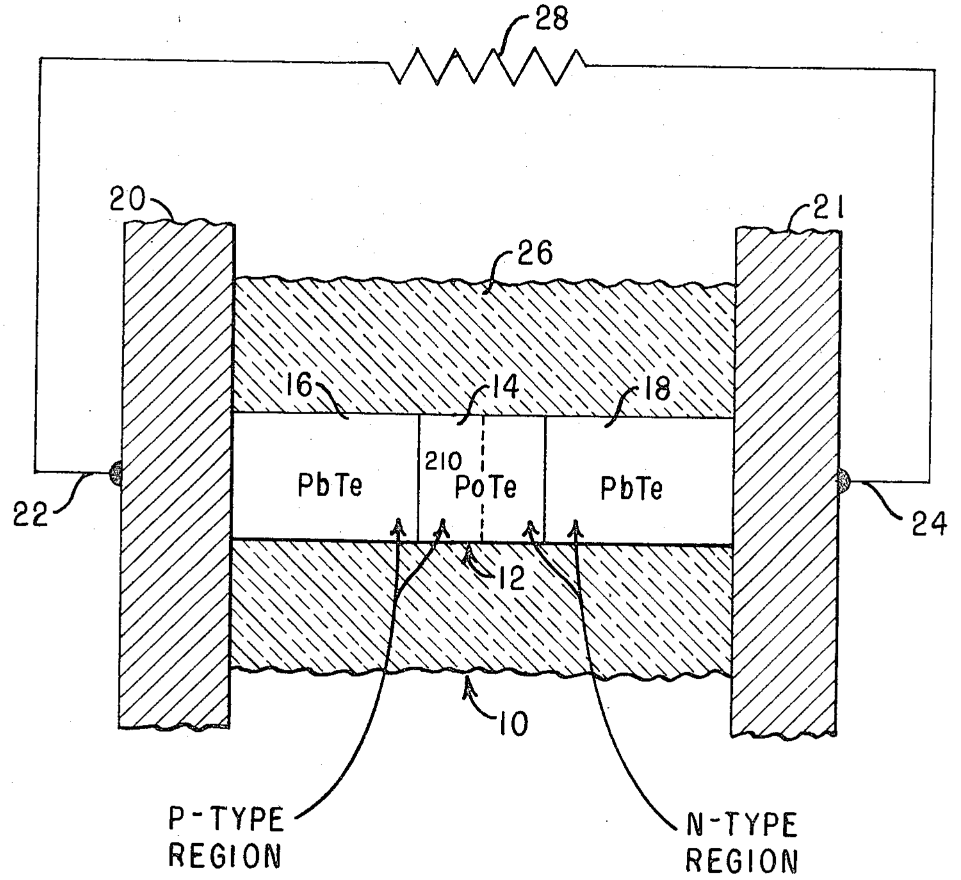
INVENTOR.
Le Conte Cathey
BY
ATTORNEY 3,677,825

THERMOELECTRIC GENERATOR

Le Conte Cathey, Columbia, S.C., assignor to the United States of America as represented by the United States Atomic Energy Commission Filed Oct. 30, 1968, Ser. No. 772,074
Int. Cl. G21d 7/00
U.S. Cl. 136—202 6 Claims

ABSTRACT OF THE DISCLOSURE

A thermoelectric generator having an integral radioisotope heat source-thermoelectric converter element. The heat source is disposed in intimate contact between thermoelectric converter legs and is fabricated from a compound that on radioactive decay is converted to the same compound as the thermoelectric converter material. A suitable heat source material is polonium-210, in the form of PoTe, that converts on decay to lead-206, in the form of PbTe, so that the thermoelectric converter legs are fabricated from compatible PbTe. The latter compound is suitably doped to provide the desired semiconductor characteristics.

BACKGROUND OF THE INVENTION

The invention described herein was made in the course of, or under a contract with the U.S. Atomic Energy Commission.

Field of the invention

This invention relates to thermoelectric generators of the type utilizing a radioactive isotope as the heat source. More particularly, this invention relates to such radioisotopic generators wherein the radioactive material is an integral part of a body of semiconductor material.

Description of the prior art

The radioisotopic generator has found a significant number of important applications in recent years. The success of the radioisotopic generator in missions connected with space exploration is well known. These generators have also proven very useful in terrestrial applications where electric power is needed in remote locations, such as for weather stations and navigational beacons.

The nature of these applications makes it extremely important that the radioisotopic generator be highly reliable. Also, in space applications in particular, there is great incentive to minimize the total weight of the generator.

In my U.S. application Ser. No. 420,840 filed Dec. 23, 1964 and entitled "Self-Generating Thermoelectric Converter" a very advantageous configuration for a thermoelectric generator is shown wherein the radioisotopic heat source is an integral part of a semiconductor material which is chemically uniform throughout. As an example, a bar of semiconductor material of plutonium telluride has a center portion wherein the plutonium in chemical combination with the tellurium is the radioactive isotope $^{238}$Pu and in the remainder of the bar the plutonium is the more stable isotope, $^{239}$Pu. Each half of the semiconductor bar is doped with an appropriate N-type or P-type impurity to provide the desired polarities at opposite ends of the semiconductor bar. Accordingly, the heat source and the thermoelectric converter legs of a thermoelectric generator are combined into a chemically integral bar of semiconductor material.

While the chemically uniform heat source thermoelectric converter bar hereinabove described is quite advantageous for heat source application of $^{238}$P and other radioisotopes with relatively long half-lives. I have found that a more advantageous arrangement can be used for radioisotopes of shorter half-lives, particularly the isotope polonium-210.

The selection of a particular isotope for a specific use entail the matching of the isotope characteristics to the requirement of the particular use. This is particularly true with respect to the characteristics of half-life and initial power density which are roughly inversely proportional. $^{238}$Pu with a relatively long half-life of 89 years has an initial power density of 0.55 watt/gram as compared to the 141 watts/gram of $^{210}$Po which has a half-life of only 0.38 year. It can be appreciated that for uses, such as aerospace missions, of less than three months duration where the conservation of weight is a primary consideration, $^{210}$Po would be a much better choice than $^{238}$Pu, other factors being equal.

SUMMARY OF THE INVENTION

Accordingly, it is an object of the present invention to provide an integral radioisotope heat source-thermoelectric converter element particularly advantageous for shorter-lived isotopes such as $^{210}$Po.

This is accomplished by making the thermoelectric converter portions of the integral unit from a semiconductor compound which is chemically identical to the decay product of the heat source material. Where $^{210}$Po is the heat source radioisotope, the heat source material can be PoTe in which case the thermoelectric converter legs on either side of the heat source is made from PbTe, lead-206 being the decay product of polonium-210.

Other objects and advantages of the present invention will become apparent from a consideration of the following detailed description and accompanying drawing of a preferred embodiment of the invention.

BRIEF DESCRIPTION OF THE DRAWING

The single figure of the drawing illustrates a preferred embodiment of the present thermoelectric generator partially in schematic with some components broken away and partially in section.

DESCRIPTION OF THE PREFERRED EMBODIMENT

Referring to the single figure of the drawing, the improved thermoelectric generator 10 is an integral heat source-thermoelectric converter element 12 having in its central region a radioisotope heat source portion 14 bounded on either side by thermoelectric converter legs 16 and 18. Heat sink material 20 and 21 abuts and makes a good thermal contact with the respective terminal end of each converter leg 16 and 18 and the element 12 is otherwise completely surrounded by suitable thermal insulation 26.

Electrical leads 22 and 24 electrically connect the generator to an external load such as resistor 28. While a single element 12 is illustrated for exemplary purposes, it will be appreciated that a single thermoelectric generator may have several or many identical heat-source elements in a parallel, or other electrical array, thermally isolated from each other.

Thermoelectric convertor element 12 is an integral bar of semiconductor material possessing good thermoelectric properties, i.e. low thermal conductivity, high electrical conductivity, small band gap for excitation of carriers, stable crystal structure, and controllable electronic characteristics so that the junction fabrication can be accomplished and remain stable over the temperature range of application. The heat source portion 14 of the element 12 is fabricated from a radioactive component that upon radioactive decay is converted to substantially the same chemical compound as the thermoelectric material that is used in the converter legs 16 and 18. I have found that the lead telluride-polonium telluride system provides a particularly suitable set of compatible materials and that the preferred combination is polonium telluride, the polonium being enriched in the isotope polinium-210, for the heat source portion 14 and lead telluride, suitably doped, for the thermoelectric converter legs 16 and 18. Since $^{210}Po$ decays by alpha emission to lead-206, the decay product of the isotopic heat source portion 14 is chemically identical to the lead telluride compound of converter legs 16, 18. This inherent compatibility of heat source and converter leg materials makes possible a reduction in weight of the overall thermoelectric generator, eases the problem associated with thermal coupling of the hot junctions of the generator, and allows greater flexibility of generator geometry by making each junction an independent source of power.

The integral bar of semiconductor material used for converter element 12 is fabricated by generally known metallurgical process for preparing semiconductor materials, such as by powder metallurgy techniques. For instance, a polonium telluride pellet is formed by reacting the two components in an intimate mixture. The resulting mass is crushed and sintered to form a $^{210}PoTe$ pellet. Similarly, the converter leg material, PbTe, is also formed by conventional powder metallurgy techniques. The resulting PbTe pellets are fused to the PoTe pellet at the interfaces by carefully controlled heat under pressure. In these steps it is important to stabilize the amount of tellurium evaporated away due to high temperature. Those skilled in the semiconductor art will recognize that the converter legs 16 and 18 must be "oppositely doped" in a manner well known in the art. In the illustrated embodiment converter leg 16 is doped to provide a P-type region and leg 18 is doped to provide an N-type region. In this preferred embodiment, the P-type region is PbTe doped with about 0.3 atom percent sodium and the N-type region is PbTe doped with about 0.03 mole percent lead iodide. In this connection, it will be recognized that the heat source portion 14 of the element is also doped in fabrication by suitable semiconductor doping techniques so that on radioactive decay the portion of said source adjacent the P-type region is converted to P-type thermoelectric material and the portion of said source adjacent the N-type material is converted to N-type thermoelectric material. The ratio of P-type material to N-type material in the source will be in the same ratio as the original regions of P-type to N-type thermoelectric material in the initially fabricated element.

Although the N-type and P-type material in the figure is shown equal in length, it will be recognized that in actual practice the length and diameter of each portion of the element 12 would be adjusted to achieve optimum efficiency for the thermoelectric generator. In this embodiment, the quantity of N-type material to P-type material is preferably in the ratio of about 1 (N) to 2 (P).

Suitable thermal insulation 26, such as glass wool or similar material is shown surrounding the thermoelectric element 12. However, if more than one element is used, it is possible to place elements in parallel to each other and reduce the amount of insulation required. The elements remain electrically separated except for the connections made on the cold ends of the heat sinks 20, 21.

In use, the cold ends of each converter leg 16, 18 are electrically connected to an external load 28 through the heat sinks 20, 21 and electrical leads 22, 24 as schematically illustrated in the accompanying figure. The power output of the device will, of course, depend upon the type and quantity of heat source material, semiconductor material, and the impurity material which is used to dope the bar. These characteristics are selected to give a high Seebeck coefficient, a relatively high electric conductivity and a low thermal conductivity.

It is not intended that the invention be limited to the specific embodiment illustrated herein, but only by the scope of the appended claims.

What is claimed is:

1. An improved thermoelectric generator comprising a radioactive isotope heat source and a thermoelectric material including an N-type semiconductor leg and a P-type semiconductor leg, said heat source being disposed between said semiconductor legs in intimate contact therewith and being selected from a compound that on radioactive decay is converted to the same compound as said thermoelectric material.

2. The improved thermoelectric generator of claim 1 wherein said radioactive isotope heat source is polonium telluride and said thermoelectric material is lead telluride.

3. The improved thermoelectric generator of claim 2 wherein the radioactive isotope in the polonium telluride is polonium-210 that converts on radioactive decay to lead-206.

4. The improved thermoelectric generator of claim 1 wherein said heat source is doped so that on radioactive decay a portion of said heat source is converted to N-type thermoelectric material and a portion is converted to P-type thermoelectric material.

5. The improved thermoelectric generator of claim 1 wherein said material is doped to form N-type and P-type material in the ratio of about 1 to 2.

6. The improved thermoelectric generator of claim 1 wherein said material is doped with sodium and iodine.

References Cited

UNITED STATES PATENTS

| | | | |
|---|---|---|---|
| 2,437,913 | 3/1948 | Frondel | 310—3 UX |
| 3,012,143 | 12/1961 | Cheek et al. | 310—3 B |
| 3,154,501 | 10/1964 | Hertz | 136—202 X |

CARL D. QUARFORTH, Primary Examiner

J. M. POTENZA, Assistant Examiner

U.S. Cl. X.R.

310—3 B. 3 R